United States Patent
Leikermoser et al.

(10) Patent No.: US 9,933,457 B2
(45) Date of Patent: Apr. 3, 2018

(54) DEVICE FOR TESTING ELECTRONIC COMPONENTS

(71) Applicant: Multitest elektronische Systeme GmbH, Rosenheim (DE)

(72) Inventors: Volker Leikermoser, Aschau (DE); Gerhard Gschwendtberger, Brannenburg (DE)

(73) Assignee: Multitest Elektronische Systeme GmbH, Rosenheim (DE)

( * ) Notice: Subject to any disclaimer, the term of this patent is extended or adjusted under 35 U.S.C. 154(b) by 290 days.

(21) Appl. No.: 14/643,559

(22) Filed: Mar. 10, 2015

(65) Prior Publication Data
US 2015/0260758 A1  Sep. 17, 2015

(30) Foreign Application Priority Data
Mar. 11, 2014  (DE) .......................... 10 2014 103 262

(51) Int. Cl.
*G01R 31/20* (2006.01)
*G01R 3/00* (2006.01)
(Continued)

(52) U.S. Cl.
CPC .............. *G01R 3/00* (2013.01); *G01R 1/0408* (2013.01); *G01R 1/0433* (2013.01); *G01R 1/067* (2013.01);
(Continued)

(58) Field of Classification Search
CPC ............ G01R 31/2887; G01R 31/2808; G01R 31/2879; G01R 31/2889; G01R 31/2896; G01R 1/06705; G01R 1/07392; G01R 1/0416; G01R 1/07378; G01R 1/0466
See application file for complete search history.

(56) References Cited

U.S. PATENT DOCUMENTS 6,118,290 A *  9/2000  Sugiyama .......... G01R 31/2886
324/750.22
6,466,046 B1 * 10/2002  Maruyama ......... G01R 31/2886
324/754.15
(Continued)

FOREIGN PATENT DOCUMENTS

DE    10 2008 029 129 A1    12/2009
JP          2008-45937         2/2008
(Continued)

OTHER PUBLICATIONS

Extended European Search Report for parallel European Patent Application No. 15158653.4, dated Aug. 4, 2014, with English summary, 9 pages.

*Primary Examiner* — Tung X Nguyen
*Assistant Examiner* — Dominic Hawkins
(74) *Attorney, Agent, or Firm* — Lewis Roca Rothgerber Christie LLP

(57) ABSTRACT

Embodiments of the invention is based on a device for testing electronic components with at least one test socket with test contacts, with a nest, in which at least one electronic component can be placed, and with at least one cleaning unit for the test contacts of the test socket, wherein by means of a relative movement, which can be carried out as a test stroke, between the test socket and nest the electronic component can be pressed against, and lifted from, the test contacts of the test socket. According to embodiments of the invention the at least one cleaning unit is designed in such a manner that during each test stroke the test contacts come into contact with the at least one cleaning unit.

11 Claims, 4 Drawing Sheets

(51) Int. Cl.
    *G01R 31/319*     (2006.01)
    *G01R 1/04*       (2006.01)
    *G01R 1/073*      (2006.01)
    *G01R 1/067*      (2006.01)
    *B08B 1/00*       (2006.01)

(52) U.S. Cl.
    CPC ... *G01R 1/07307* (2013.01); *G01R 31/31905* (2013.01); *B08B 1/00* (2013.01)

(56) References Cited

U.S. PATENT DOCUMENTS

| | | | |
|---|---|---|---|
| 7,492,172 B2 * | 2/2009 | Stewart | G01R 31/2887 324/756.02 |
| 2003/0092365 A1 * | 5/2003 | Grube | B08B 7/0028 451/178 |
| 2003/0138644 A1 * | 7/2003 | Khandros | B08B 1/00 428/447 |
| 2003/0206031 A1 * | 11/2003 | Harris | G01R 1/07314 324/750.22 |
| 2004/0096643 A1 * | 5/2004 | Sato | B08B 1/00 428/308.4 |
| 2007/0205753 A1 | 9/2007 | Hau et al. | |
| 2011/0132396 A1 | 6/2011 | Humphrey et al. | |

FOREIGN PATENT DOCUMENTS

| | | |
|---|---|---|
| JP | 2009-152264 | 7/2009 |
| WO | WO 2009/153032 A1 | 12/2009 |

* cited by examiner

DEVICE FOR TESTING ELECTRONIC COMPONENTS

This application claims the benefit of the filing date of the German Patent Application No. 10 2014 103 262.4 filed 11 Mar. 2014, the disclosure of which is hereby incorporated herein by reference.

FIELD OF THE INVENTION

Embodiments of the invention relate to a device for testing electronic components.

TECHNOLOGICAL BACKGROUND

Normally, after manufacture, electronic components are subject to designated tests so that their electrical function is verified. For this purpose, usually a nest is attached to a stamp that moves up and down, in which nest the electronic component is precisely positioned. However, it is also known to attach several electronic components on one carrier, and to position the entire carrier in the nest.

The stamp and the nest form a part of a handling device, the so-called handler. Usually, a test head is attached to the handler, by means of which test-head the incoming signals are evaluated, and a decision relating to the quality of the tested electronic components is made. The electronic components are contacted individually by means of a test socket or—if a carrier is used—in groups with one or several test sockets at the same time. In this process the contacts of the electronic components are pressed at a predetermined force against the test contacts of the test socket or test sockets.

It has been found out that the test contacts of the test sockets become dirty over time, e.g. as a result of deposits of tin and its oxidation, wherein the conductivity is reduced, and a meaningful testing of the electronic components becomes increasingly difficult. For this reason the test contacts need to be cleaned or exchanged at relatively short intervals.

For this purpose it is necessary to interrupt the testing, and for the test sockets to be deinstalled and often even dismantled. After the test contacts have been cleaned or exchanged, an assembling and a restarting of the test device take place in the reverse order.

Attempts have already been made to provide a cleaning device which, after testing has been taking place for a predetermined number of test procedures, automatically interrupts testing, moves to the region of the test socket, and mechanically cleans the test contacts, for example by means of brushes. However, in this method, too, the actual testing of the electronic components needs to be interrupted, and consequently the average cycle time is prolonged.

Likewise, so-called cleaning dummies have already been used. These cleaning dummies have the same shape as the electronic components to be tested. However, instead of contacts, components with a cleaning function are provided. Because of the small amount of relative movement between the parts that have a cleaning function and the test contacts of the test sockets, the cleaning effect can only be assessed as being minimal. Therefore it is very often necessary to incorporate such cleaning dummies in the test procedure and in this manner prevent deterioration of the test results. Likewise, there are very limited possibilities for retrofitting cleaning dummies to older handlers, because these older devices are not able to distinguish the cleaning dummies from electronic components to be tested. In this approach, too, the average cycle time is prolonged.

US 2011/0132396 A1 discloses a cleaning material for cleaning contact elements and carrier structures of test interfaces, for example of test sockets, which are used for functional tests of semiconductor components. The cleaning material comprises a cleaning layer, beneath which several intermediary layers are arranged that support the cleaning layer. By means of the cleaning material it is possible to remove dirt build-up from the contact elements and from the carrier structures.

DE 10 2008 029 129 A1 discloses a contacting device for contacting electronic components, in particular ICs, by means of contact springs of a contact socket. A belt cleaning device with a belt movement mechanism and a cleaning belt is provided, which cleaning belt is guided over the contact springs of the contact socket. The cleaning belt comprises at least one recess, through which a component can be fed, and at least one cleaning region, which on its side facing the contact springs comprises an adhesive layer.

US 2007/0205753 A1 discloses a method for cleaning contact pins of an automatic test device, wherein a replacement cleaning device is inserted in a test socket in order to clean the contact pins by means of a cleaning agent.

SUMMARY OF THE INVENTION

There may be a need to provide a device for testing electronic components, which device minimises, or entirely overcomes, the disadvantages of the known devices.

According to embodiments of the invention, this need is met by a device for testing electronic components, which device comprises the features of claim 1. Because the at least one cleaning unit is designed in such a manner that during each test stroke the test contacts come into contact with the at least one cleaning unit, the test contacts are cleaned before and/or after each test, and consequently no significant deposit can form on the test contacts. Furthermore, a cleaning does not necessitate any interruption in testing. Since cleaning is practically carried out during the test stroke, no additional time for cleaning needs to be allowed, and consequently the average cycle time is not prolonged.

Cleaning does not necessitate the use of aggressive cleaning agents, because cleaning takes place during each test stroke. Consequently, in each case only very minor dirt build-up needs to be removed. Furthermore, there is no danger of deposits solidifying as a result of drying or oxidation, because any deposits that may be transferred from an electronic component to the test contacts are removed already prior to the next electronic component being tested.

Further details and advantages of embodiments of the invention are stated in the dependent claims.

In one embodiment of the invention the at least one cleaning unit is mounted in such a manner that it moves together with the nest. Consequently, the cleaning unit partakes in each movement of the nest. It is thus ensured that whenever the nest moves into the test position, a cleaning procedure is carried out. However, a second cleaning procedure is carried out when the nest is moved back to a position in which the already tested electronic component is replaced by an electronic component that has not yet been tested. This means that for each test cycle two cleaning procedures are carried out, namely one cleaning procedure before testing, when the nest is moved to the test position, and one cleaning procedure after testing, when the nest is moved back again.

In a first exemplary embodiment the at least one cleaning unit is mounted to the nest or to a stamp that moves the nest. In this exemplary embodiment the number of cleaning units being necessary depends on the position of the contacts of the electronic components. If the contacts are, for example, arranged on two opposite sides of the electronic component, likewise, two cleaning units are used. In contrast to this, if the contacts are distributed over all four sides of the electronic component, four cleaning units may be necessary, because the test contacts of the test socket are also arranged correspondingly. In contacts of the electronic component, which contacts are arranged at one side, and with correspondingly arranged test contacts of the test socket, one cleaning unit is sufficient.

In order to fix electronic components, which are to be tested, with positional accuracy in the nest, special holding elements are often used. These holding elements are usually coupled to the nest by means of a latching mechanism so that the electronic component to be tested is situated between the nest and the holding element. In a second exemplary embodiment of the invention, in which embodiment the electronic component is fixed in the next by means of a holding element, it is possible to attach the at least one cleaning unit on the holding element. It is, of course, also possible to integrate the cleaning function directly in the holding element.

In a further embodiment the at least one cleaning unit attached to the test socket in a movable manner. In this embodiment the cleaning unit does not partake in the entire movement of the nest; instead, it uses the nest only as a drive for a movement that needs only be far enough for the cleaning unit to be able to carry out its cleaning function.

There is the option of coupling the cleaning unit, for example magnetically or mechanically, to the movement of the nest, and of cancelling such coupling during the return movement of the nest. However, it is particularly advantageous if the at least one cleaning unit is movable towards the test socket against the force of an elastic element. In this manner no coupling is necessary because as the contact pressure diminishes during the return movement of the nest, the cleaning unit is pressed back into its initial position by the elastic element.

In this arrangement the at least one cleaning unit can be moved by the nest itself or by components coupled to the nest. Such a component coupled to the nest can, for example, be the electronic component itself, which component is to be tested. However, in order to prevent damage to the electronic component, advantageously a holding element or a push ram especially provided for this purpose on the nest can be used.

In this embodiment, too, for each test cycle two cleaning procedures are carried out so that in all the variants intensive cleaning of the test contacts occurs, and any deposit of undesirable particles can reliably be prevented.

Advantageously, the at least one cleaning unit comprises a basic body and at least one contact module. Depending on the exemplary embodiment, several cleaning units with only one contact module can be provided, or only one cleaning unit with several contact modules can be provided.

The contact modules can be designed in a host of different ways. It has been shown to be advantageous if the at least one contact module comprises bristles. The bristles can be selected in such a manner that they achieve a good cleaning effect without wearing or damaging the test contacts. The desired characteristics can be set by way of the surface, the length, the thickness or strength, and the elasticity of the bristles.

However, it is also possible to manufacture the contact module from some other material. It has also proven effective for the at least one contact module to comprise an elastic plastic material, wherein a surface of the at least one contact module, which surface cleans the test contacts, has a predetermined roughness. Such contact modules can, for example, be made very economically from foam material, wherein again the desired characteristics can very easily be set by way of the base material and the weight per unit of volume of the foam material.

Advantageously, the at least one contact module has a hardness that ensures constant cleaning of the test contacts of the test socket, without in this process damaging the test contacts. However, this means that advantageously the contact modules are designed so as to be softer than the test contacts, and are therefore subject to wear. In order to be able to ensure continuous cleaning of the test contacts, in one embodiment the at least one cleaning unit is exchangeable.

In a further embodiment, for the same reasons only the at least one contact module is exchangeable. In each respective case the investment costs versus the labour costs for the exchange need to be evaluated.

Further details and advantages of embodiments of the invention result from the description of exemplary embodiments that are explained in detail with reference to the drawing.

BRIEF DESCRIPTION OF THE DRAWING

The following are shown.

DETAILED DESCRIPTION OF EXEMPLARY EMBODIMENTS

Figure 5:
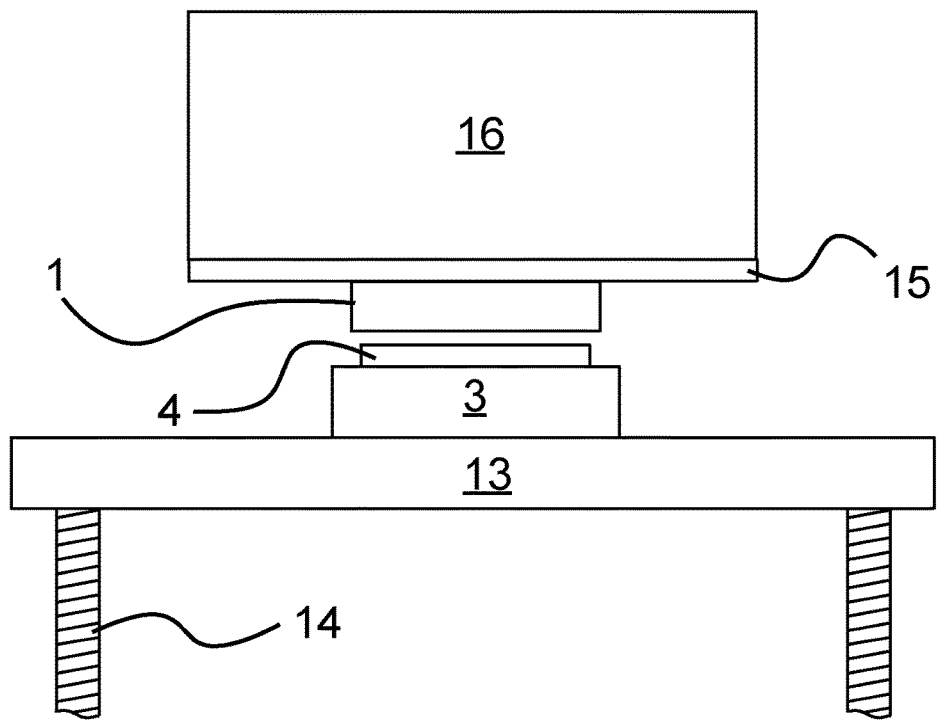
FIG. 5 a simplified diagrammatic view of a handler for individual tests.

The handler according to FIG. 5 comprises a compression stamp 13 that by means of the threaded rods 14 can be evenly moved upwards and downwards. On the compression stamp 13 the nest 3 is provided that forms the receiving device for the electronic component 4 to be tested. However, it is also possible to provide a carrier that can be positioned by way of an X-Y-displacement device and that holds a plurality of electronic components to be tested.

Reference numeral 1 designates a test socket or a test socket array. By means of a test socket array several electronic components can be tested at the same time. However, since in the present embodiment of invention it is immaterial as to whether in a particular instance only one electronic component or several electronic components are tested at the same time, the device according to an embodiment of the invention is to be explained with reference to a single test procedure.

The nest 3 is positioned on the compression stamp 13 in such a manner that the electronic component 4, which is located therein, with its contacts is located precisely underneath the test contacts of the test socket 1. Above the compression stamp 13 and the nest 3 the test head 16 is installed as a fixed, immobile module. The connection between the test head 16 and the test socket 1 is established by the load board 15.

For testing the electronic component 4 the compression stamp 13 is moved to the top, and the contacts of the electronic component are pressed with very considerable force against the test contacts of the test socket 1. Advantageously, the contact pressure is sufficient for a conductive connection to be able to be established between the contacts of the electronic component 4 and the test contacts (not shown in the diagram) of the test socket 1. Only thereafter is testing carried out according to a predetermined program.

On completion of testing, the compression stamp 13 is lowered so that the contacts of the electronic component move away from the test contacts of the test socket 1. In the lowermost position the already tested electronic component can then, for example, be removed by a pick-and-place device and can be exchanged for an electronic component yet to be tested.

In all three exemplary embodiments according to FIGS. 1 to 3 the test socket 1 with the test contacts 2, the nest 3 and the electronic component 4 to be tested with the contacts 5 are shown in the same manner. In all the figures identical components have the same reference numeral. In FIGS. 1 to 3 the compression stamp 13 is not shown, but is indicated by the dual arrow underneath the nest 3.

At two opposite sides the test socket 1 comprises test contacts 2. In the diagram the test contacts are shown as contact springs whose tips can be pressed against the test socket 1. The angle at which the contact springs are attached to the test socket deviates only slightly from an angle of 90°. In this manner any yielding of the tip of the test contacts results in only a slight offset of the test tip in the horizontal plane. Consequently, the allocation between the tips of the test contacts 2 and the contacts 5 of the component 4 to be tested is maintained even during spring travel of the test contacts 2.

Here, an embodiment of the invention is explained with reference to a test socket with test contacts that are designed as contact springs. However, embodiments of the invention can also be used in the case of test sockets whose test contacts are designed as spring-loaded test pins.

Figure 1A:
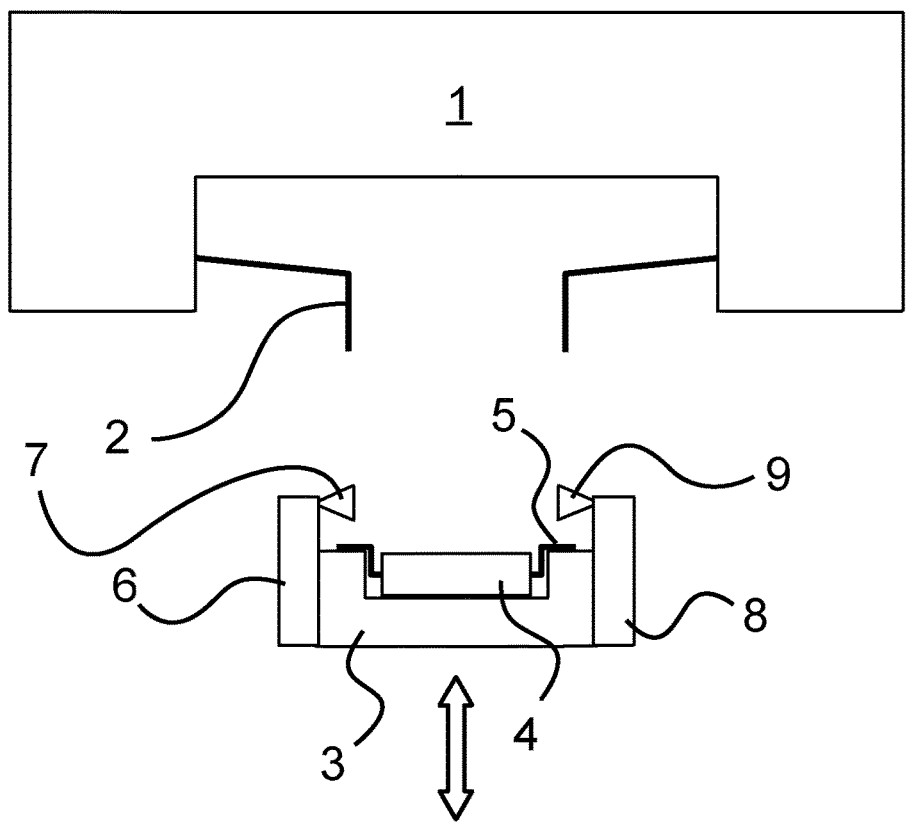
FIGS. 1a and 1b a diagrammatic partial view of a first exemplary embodiment of the invention in various positions.
Figure 1B:
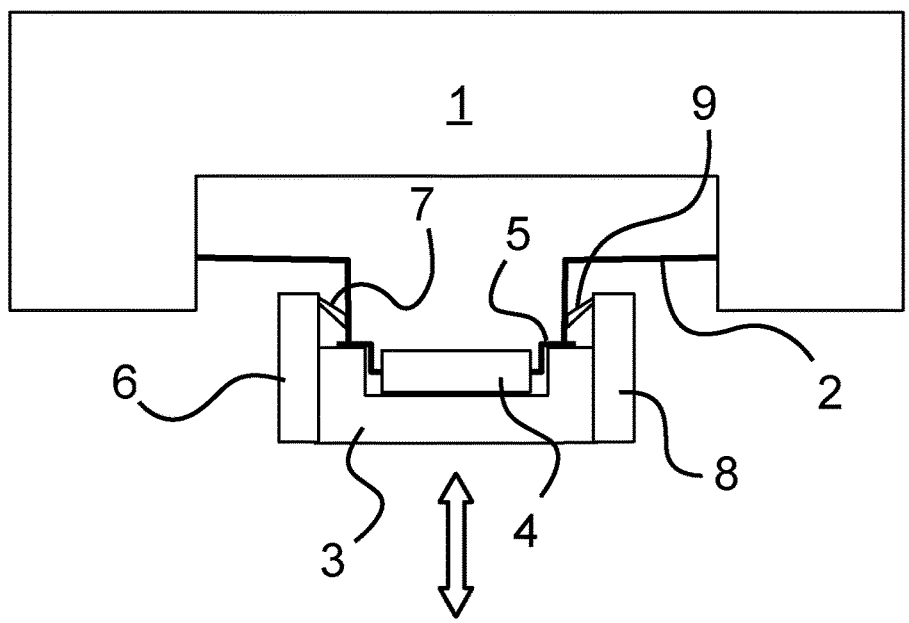

In the exemplary embodiment according to FIG. 1a and FIG. 1b at each of two opposite sides of the nest 3 there is attached a cleaning unit 6, 7 and 8, 9. In this embodiment each cleaning unit comprises a basic body 6, 8 and a contact module 7, 9. Advantageously, both cleaning units are screwed to the nest 3 or are affixed to the nest 3 by way of a detachable snap-lock connection. The contact modules 7, 9 are designed in the manner of paintbrushes and comprise bristles. The bristles have been selected so that fresh deposits can be removed from the test contacts 2, but that even a very large number of test strokes does not result in damage to the test contacts 2.

Since the test contacts 2 must not wear during relative movement between the test contacts 2 and the contact modules 7, 9, the contact modules 7, 9 will be spent over a period of time. The contact modules therefore need to be renewed from time to time. In principle there is the option either of exchanging only the contact modules 7, 9, or the entire cleaning units together with the basic bodies 6, 8. The question as to which of the two options is the more economical will, for example, depend on the type of the contact module used.

At the beginning of a test stroke the nest 3 moves upwards against the test socket 1. During this movement the test contacts 2 come into contact with the contact modules 7, 9, push them downwards somewhat and in this process elastically deform the contact modules 7, 9. During the further movement right to the test position (see FIG. 1b) the elastically deformed contact modules 7, 9 brush or rub along the test contacts 2. In this process any deposits such as dirt particles or tin particles are removed from the test contacts. In the test position the limb of the test contacts 2, which limb is attached to the test socket 1, is practically aligned horizontally.

After testing, there can again be deposits on the test contacts 2. Therefore, during the downwards movement of the nest 3 the contact modules 7, 9 are elastically deformed in the other direction and again brush along the test contacts in order to immediately remove these deposits too.

Consequently, the test contacts are cleaned twice with every test stroke, namely once during the upwards movement and once during the downwards movement of the nest 3. In this process, cleaning takes place during the normal test stroke so that no additional movements are required. In this way no prolongation of the average test cycle has to be accepted. Cleaning of the test contacts thus takes place without the slightest loss of time.

As a result of the cleaning process the conductivity between the test contacts 2 of the test socket 1 and the contacts 5 of the electronic component 4 to be tested remains intact considerably longer during testing. This results in the test contacts 2 having to be exchanged less frequently. Lastly, the arrangement according to embodiments of the invention thus even results in a shortening of the average cycle time.

Figure 2A:
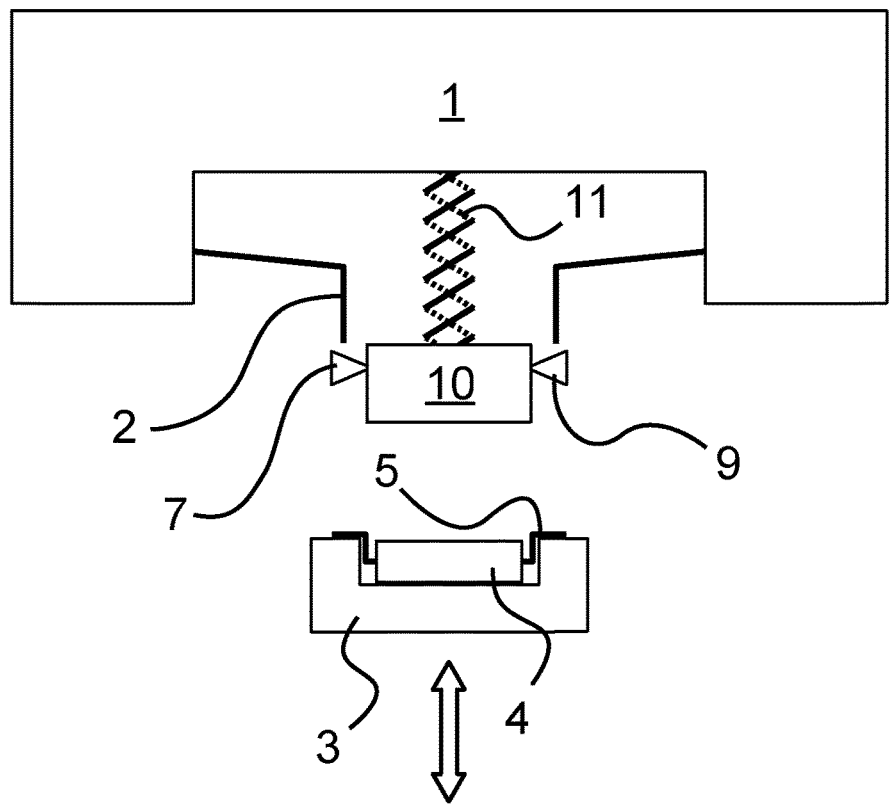
FIGS. 2a and 2b a corresponding partial view of a second exemplary embodiment in the same positions.
Figure 2B:
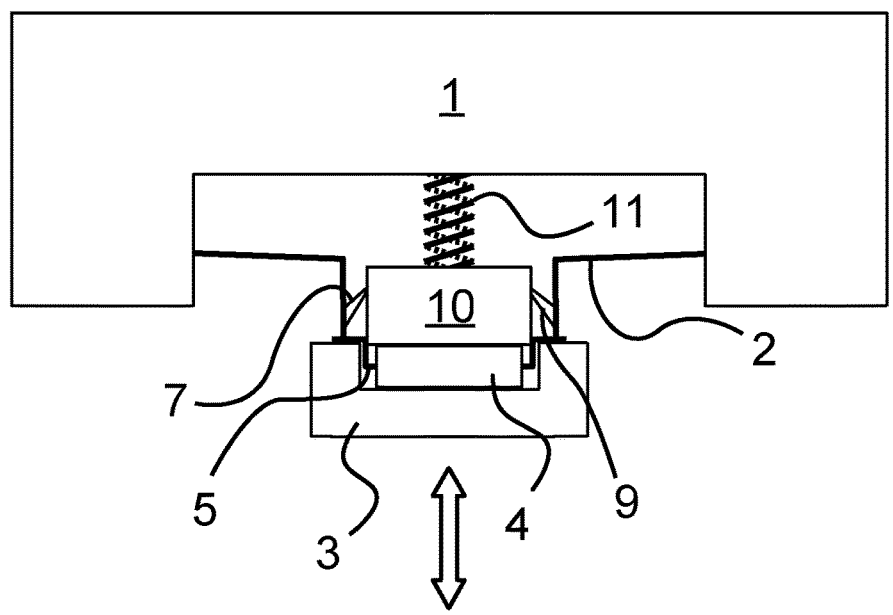

In the exemplary embodiment according to FIG. 2a and FIG. 2b only one cleaning unit is provided; it is installed in a manner entirely different from that in the exemplary embodiment according to FIG. 1. A single-part basic body 10, which comprises two contact modules 7, 9, is attached directly on the test socket 1 by means of a spring element 11. The cleaning unit is positioned in such a manner that in the rest position of the cleaning unit the contact modules 7, 9 are situated underneath the tips of the test contacts 2.

A guidance of the cleaning unit can be provided either by way of the spring element 1, or the test socket 1 can have its own guidance, which ensures that the cleaning unit moves only in the direction of the dual arrow and cannot break out laterally.

During the upwards movement of the nest 3 at the beginning of the test stroke the cleaning unit does not take part in the movement of the nest 3. Only when the electronic component 4 that is to be tested (see FIG. 2b) comes into contact with the underside of the single-part basic body 10, during the further movement of the nest 3 to the test position the cleaning unit takes part in the movement. For the sake of clarity, in FIG. 2 the electronic component 4 to be tested is itself shown as the driving respectively catching element for the cleaning unit. However, advantageously a catching element is provided at the nest, by way of which catching element the cleaning unit is moved without the electronic component 4 having to be misused as a slide.

In this exemplary embodiment the cleaning unit with the single-part basic body 10 and the two contact modules 7 and 9 is moved only over a very short distance. However, this movement is sufficient for the two contact modules 7 and 9 to contact the test contacts and to brush along them.

However, when compared to the exemplary embodiment according to FIG. 1, the cleaning unit only moves over a distance that is necessary for cleaning the test contacts 2. The cleaning unit does not take part in the movement over the remaining distance over which the nest 3 is moved.

The cleaning effect is however identical to that in the exemplary embodiment according to FIG. 1. Again, the test contacts 2 are cleaned twice, namely before and after each test procedure. Likewise, advantageously, exchangeability should be ensured. Therefore, again, either the two contact modules 7, 9 or the complete cleaning unit with the single-part basic body 10 and the two contact modules 7 and 9 can be exchanged.

Figure 3A:
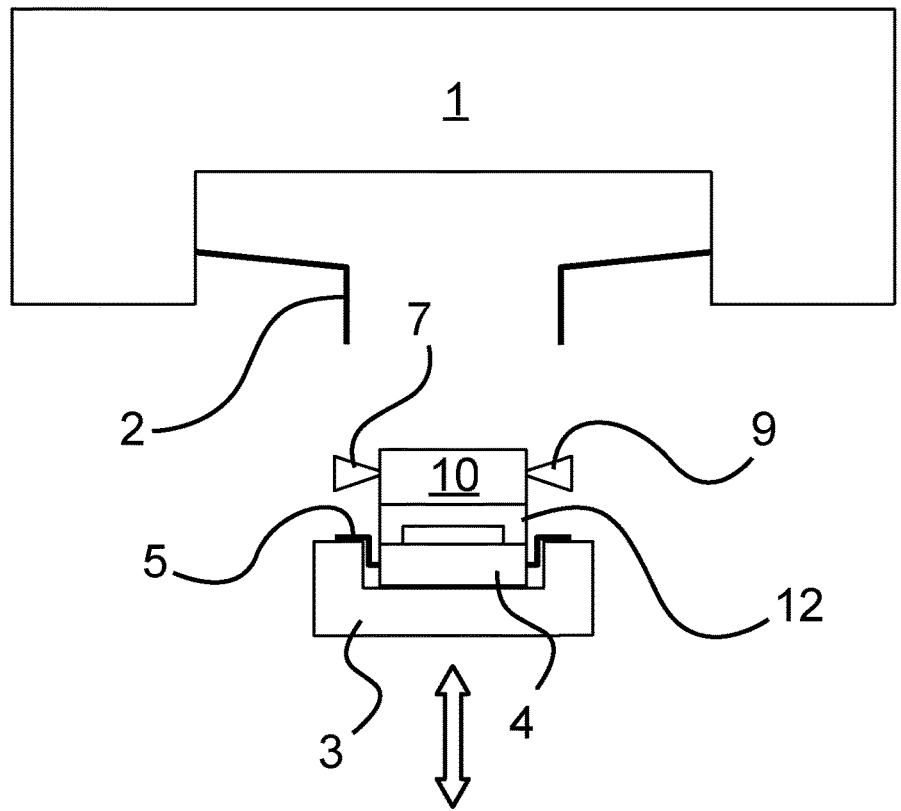
FIGS. 3a and 3b a view of a third exemplary embodiment.
Figure 3B:
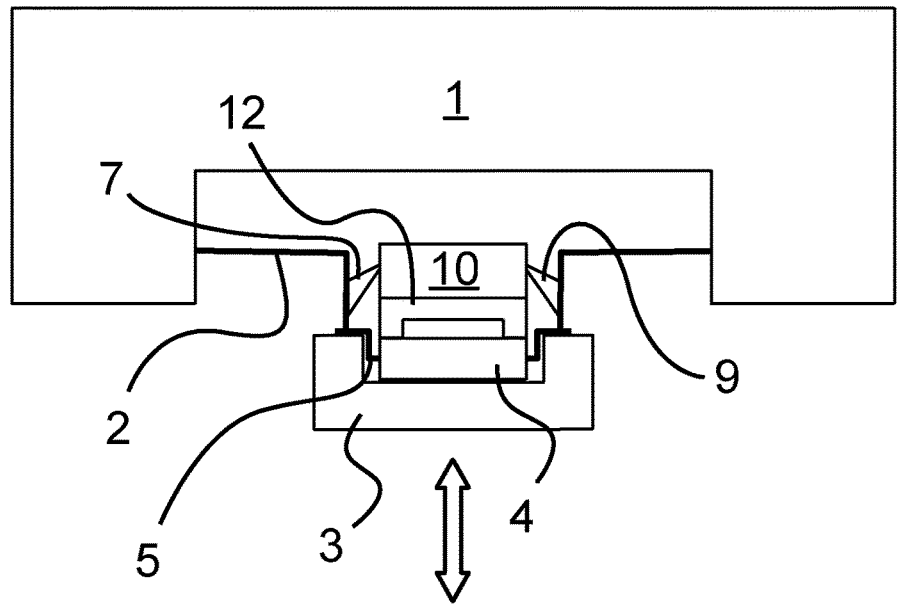

A further exemplary embodiment is shown in FIG. 3a and FIG. 3b. In this embodiment a holding element 12 is provided that among other things is designed to fix, in the nest 3, the electronic component 4 to be tested. Even in the case of a horizontal alignment of the arrangement it is thus possible to reliably guide the electronic component and to hold it in the nest.

The exemplary embodiment of FIG. 3 again shows a cleaning unit with a single-part basic body 10 and two contact modules 7 and 9 connected thereto. In this figure the cleaning unit is attached to the holding element 12. However, said cleaning unit can also be designed in one part with the holding element 12 so that after corresponding wear of the contact modules 7, 9 the entire holding element 12 can simply be exchanged. On the other hand in this exemplary embodiment, too, there are to be forms in which either the basic body 10 with the two contact modules, or only the contact modules 7, 9 can be renewed.

Since also in this exemplary embodiment a movement of the cleaning unit is coupled to the movement of the nest 3, the actual procedure of cleaning the test contacts 2 takes place in the same way as in the exemplary embodiment according to FIG. 1. Here again, at the beginning of the test stroke the single-part basic body 10 with the contact modules 7, 9, together with the nest 3, is moved upwards.

Both before the actual testing of the electronic component 4 and after testing, the contact modules 7, 9 are connected with the test contacts 2 of the test socket 1, and during the relative movement of both components to each other wipe off any deposits adhering to the test contacts. Thus, here again, during each instance of testing, two cleaning procedures on the tips of the test contacts 2 take place.

Embodiments of the invention can also be used in devices in which instead of the nest the test socket is moved. Since it is only the relative movement between the nest with the electronic component held therein, and the test socket with the test contacts that matters, in such a device, too, effective cleaning with two cleaning procedures takes place with each test stroke.

Figure 4A:
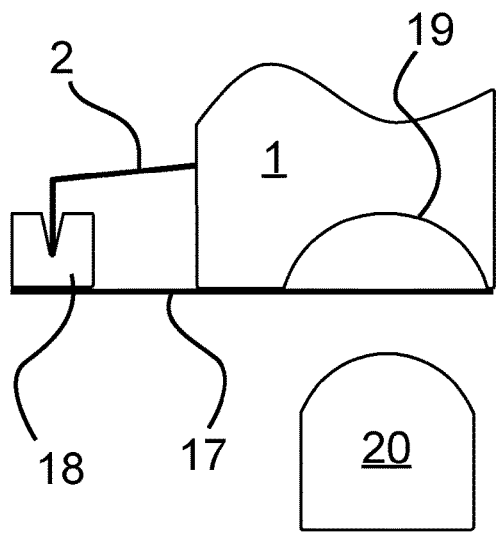
FIGS. 4a and 4b a detail of a further exemplary embodiment.
Figure 4B:
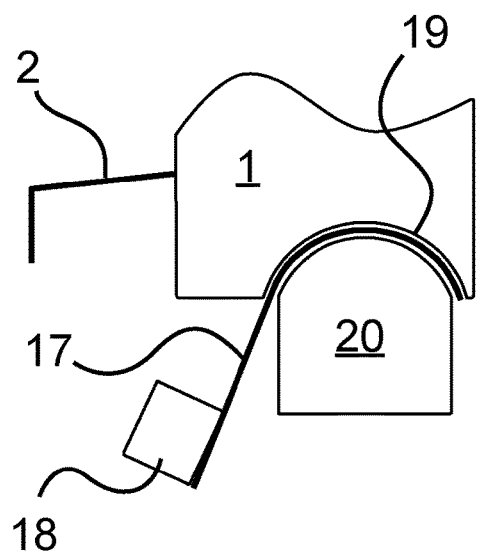

In FIG. 4a and FIG. 4b there is shown an exemplary embodiment in which the cleaning unit, as is the case in the exemplary embodiment according to FIG. 2, is attached to the test socket 1 but is moved by the nest 3 or by parts coupled to the movement of said nest 3. Instead of the bristles used in the other exemplary embodiments, in this embodiment an elastomer pad 18 is provided for cleaning the test contacts 2. Depending on the particular application, the elastomer used can also comprise ceramic particles.

The elastomer pad 18 is attached to an end of a leaf spring 17 whose opposite end is mounted to the test socket 1 so that an articulated joint is formed. Since a multitude of attachment types is possible in this application, the articulated attachment is not shown in the drawing. In the rest position shown in FIG. 4a the leaf spring 17 rests against the underside of the test socket 1, thus pressing the elastomer pad 18, which is attached on one side, from below against the test contact 2. Since the tip of the test contact 2 presses into the surface of the elastomer pad 18, thus an approximately wedge-shaped indentation arises in the surface of the elastomer pad 18.

A contour depression 19 is incorporated in the underside of the test socket 1, which contour depression 19 is partly covered by the leaf spring 17. At the nest 3 or on the compression stamp 13 a contour stamp 20 that corresponds to the contour depression 19 is attached. The upper side of the contour stamp 20 matches the contour of the contour depression 19.

When the nest 3 together with the contour stamp 20 moves upwards, the contour stamp 20 comes into contact with the leaf spring 17 before the component contacts 5 move within the reach of the tips of the test contacts 2. During the further movement of the contour stamp 20 it presses the leaf spring 17 into the contour depression 19. In this process the elastomer pad 18 lifts from the tip of the test contact 2 and moves into the position shown in FIG. 4b. The elastomer pad returns to its original shape without the wedge-shaped indentation caused by the test contact.

The shape and size of the contour stamp 20 and the contour depression 19 can be matched in such a manner that after the elastomer pad 18 has been lifted, the component contacts 5 touch down on the test contacts 2 before the contour stamp 20 has reached the bottom of the contour depression 19. A further option consists of coupling the contour stamp 20 in a spring-loaded manner to the movement of the nest 3 so that the nest 3 can move to its test position even when the contour stamp 20 has already entirely plunged into the contour depression 19, and for this reason no further upwards movement of the contour stamp 20 is possible.

However, still further embodiments are possible with such a crank device. For example, the leaf spring on the left-hand side of the test socket shown in FIG. 4 could be guided in a linear manner. When the contour stamp plunges into the contour depression, the elastomer pad would then only slide to the right-hand side by a defined distance and would thus release the test contact.

LIST OF REFERENCE NUMERALS

1 Test socket
2 Test contacts
3 Nest
4 Electronic component
5 Component contacts
6 Left-hand side basic body
7 Left-hand side contact module
8 Right-hand side basic body
9 Right-hand side contact module
10 Single-part basic body
11 Spring element
12 Holding element
13 Compression stamp
14 Threaded rods
15 Load board
16 Test-head
17 Leaf spring
18 Elastomer pad
19 Contour depression
20 Contour stamp

The invention claimed is:

1. A device for testing electronic components comprising: at least one test socket with test contacts, with a nest in which at least one electronic component can be placed, and with at least one cleaning unit for the test contacts of the test socket, wherein by means of a relative upward movement or downward movement, which can be carried out as a test stroke, between the test socket and the nest the electronic component can be pressed against, and lifted from, the test contacts of the test socket, wherein the at least one cleaning unit is mounted to one of the nest, to a stamp that moves the nest and the test socket in such a manner that the at least one cleaning unit is only movable in direction to the relative upward movement or downward movement, so that during each upward movement or downward movement the test contacts come into contact with the at least one cleaning unit.

2. The device as set forth in claim 1, wherein the at least one cleaning unit is mounted in such a manner that it moves together with the nest.

3. The device as set forth in claim 2, wherein the electronic component is fixed in the nest by means of a holding element, and in that the at least one cleaning unit is fixed to the holding element.

4. The device as set forth in claim 1, wherein the at least one cleaning unit is movably attached to the test socket.

5. The device as set forth in claim 4, wherein the at least one cleaning unit is movable towards the test socket against the force of an elastic element.

6. The device as set forth in claim 4, wherein the at least one cleaning unit is moved by the nest or by components coupled to the nest.

7. The device as set forth in claim 1, wherein the at least one cleaning unit comprises a basic body and at least one contact module.

8. The device as set forth in claim 7, wherein the at least one contact module comprises bristles.

9. The device as set forth in claim 7, wherein the at least one contact module comprises an elastic plastic material, wherein a surface of the at least one contact module, which surface cleans the test contacts, has a predetermined roughness.

10. The device as set forth in claim 1, wherein the at least one cleaning unit is exchangeable.

11. The device as set forth in claim 7, wherein the at least one contact module is exchangeable.

* * * * *